(12) United States Patent
Koba et al.

(10) Patent No.: US 10,163,743 B2
(45) Date of Patent: Dec. 25, 2018

(54) COPPER FLANGED AIR CAVITY PACKAGES FOR HIGH FREQUENCY DEVICES

(71) Applicant: Materion Corporation, Mayfield Heights, OH (US)

(72) Inventors: Richard J. Koba, Saugus, MA (US); Chee Kong Lee, Euro Asia Park (SG); Wei Chuan Goh, Skudai (MY); Sin Yee Chin, Singapore (SG)

(73) Assignee: MATERION CORPORATION, Mayfield Heights, OH (US)

( * ) Notice: Subject to any disclaimer, the term of this patent is extended or adjusted under 35 U.S.C. 154(b) by 0 days.

(21) Appl. No.: 15/598,706

(22) Filed: May 18, 2017

(65) Prior Publication Data

US 2017/0338161 A1 Nov. 23, 2017

Related U.S. Application Data

(60) Provisional application No. 62/339,739, filed on May 20, 2016.

(51) Int. Cl.
*H01L 23/10* (2006.01)
*H01L 21/48* (2006.01)
*H01L 23/047* (2006.01)
*H01L 21/52* (2006.01)

(52) U.S. Cl.
CPC .......... *H01L 23/10* (2013.01); *H01L 21/4803* (2013.01); *H01L 21/52* (2013.01); *H01L 23/047* (2013.01)

(58) Field of Classification Search
CPC ....... H01L 23/047; H01L 21/48; H01L 21/52; H01L 23/10; H01L 21/4803

USPC .......................... 257/728, 675, 712, 717, 721
See application file for complete search history.

(56) References Cited

U.S. PATENT DOCUMENTS

| | | | |
|---|---|---|---|
| 4,985,753 A | 1/1991 | Fujioka et al. | |
| 5,972,737 A | 10/1999 | Polese et al. | |
| 6,335,863 B1 | 1/2002 | Yamamoto et al. | |
| 6,867,367 B2* | 3/2005 | Zimmerman | H01L 21/50 174/528 |
| 7,541,220 B2* | 6/2009 | Bambridge | H01L 23/047 257/666 |
| 2006/0189038 A1 | 8/2006 | Pavio | |
| 2007/0090514 A1 | 4/2007 | Condie et al. | |
| 2007/0090515 A1* | 4/2007 | Condie | H01L 23/047 257/704 |
| 2007/0175660 A1* | 8/2007 | Yeung | H01L 23/492 174/521 |
| 2009/0051018 A1* | 2/2009 | Moline | H01L 21/568 257/675 |

(Continued)

FOREIGN PATENT DOCUMENTS

WO   WO 2015/179733 A1   11/2015

OTHER PUBLICATIONS

International Search Report and Written Opinion for PCT/US2017/033289 dated Sep. 1, 2017.

*Primary Examiner* — Alexander Oscar Williams
(74) *Attorney, Agent, or Firm* — Fay Sharpe LLP

(57) ABSTRACT

An air cavity package includes a flange and a pedestal extending upward from the flange. A dielectric frame is joined to the flange and surrounds the pedestal. The semiconductor die is placed on the pedestal, which reduces the length of the wires joining the die to the leads of the air cavity package.

17 Claims, 3 Drawing Sheets

(56) References Cited

U.S. PATENT DOCUMENTS

2017/0323837 A1* 11/2017 Koba ..................... H01L 23/14

* cited by examiner

COPPER FLANGED AIR CAVITY PACKAGES FOR HIGH FREQUENCY DEVICES

CROSS-REFERENCE TO RELATED APPLICATIONS

This application claims priority to U.S. Provisional Patent Application Ser. No. 62/339,739, filed May 20, 2016, the contents of which are fully incorporated by reference herein.

BACKGROUND

The present disclosure relates to air cavity packages and methods for making the same.

An air cavity package typically includes one or more semiconductor dice attached to a base/flange and surrounded by a dielectric frame with electrical leads bonded on the frame. The dice are electrically joined to the leads with wires, and the package is then sealed with a lid. The air serves as an electrical insulator with a low dielectric constant. Air cavity packages are extensively used for housing high frequency devices such as radio-frequency power transistors and monolithic microwave integrated circuits (MMICs.). Surrounding a high frequency semiconductor chip with air improves the high frequency performance of the chip compared to encapsulation in a material having a higher dielectric constant and loss tangent, (e.g., an overmolding compound such as epoxy). High frequency performance can also be improved by reducing lead inductance between the transistors and leads of the package.

RF device manufacturers desire to minimize material and production costs associated with air cavity packages. Manufacturers have developed backside metallization systems that enable silicon (Si), gallium nitride/silicon carbide (GaN/SiC), or gallium nitride/silicon (GaN/Si) chips to be soldered onto low-cost copper flanges using gold-tin (AuSn) solder or nanosilver. However, it is difficult to braze a dielectric frame to the copper flange and to the electrical leads which satisfies desired cycle properties (e.g., adherence after 1,000 temperature cycles of −65° C. to +150° C.). The dielectric frame is typically made of alumina, but bonding alumina to copper is problematic due to the severe mismatch between the coefficients of thermal expansion (CTEs) of these materials. In particular, the linear CTE of copper is about 17 ppm/° C. at 20° C. whereas the linear CTE of alumina is about 8 ppm/° C. at 20° C. A large alumina frame brazed to a copper flange can only withstand thermal excursions that remain below about 200° C.

Some manufacturers have offered a dielectric frame made of liquid crystal polymer (LCP) which is overmolded onto copper leads to create a frame. LCP has a close CTE match to copper. The frame/lead subassembly can then be bonded onto a copper flange with epoxy after chips have been soldered onto the flange. However, LCP is difficult to bond with epoxy due to its extreme chemical inertness. A common failure mechanism of LCP parts is leakage at the interface between the LCP and a metal (e.g., as observed during gross leak testing in a Fluorinert® bath). Sometimes the flange surface must be roughened in order to achieve adequate adhesion between the flange and the LCP frame. For a number of reasons, the LCP frame is epoxied onto the flange between the steps of die attachment (AuSn or AuSi solder) and wire bonding.

It would be desirable to develop new air cavity packages that are simpler and/or less expensive to produce. It would also be desirable to create an air cavity package with a copper base/flange that is fully assembled with a plastic frame and electrical leads, and that can withstand subsequent assembly operations (e.g., AuSn die attachment and lid attachment) that reach temperatures of 320° C. and can withstand temperature cycling (from −65° C. to +150° C. for one thousand cycles, per MIL-STD-883 Method 1010.8 Condition C).

BRIEF DESCRIPTION

The present disclosure relates to air cavity packages including a flange having a pedestal formed thereon. With the advent of 5G wireless communications, RF transistors outputting 50 Watts of power or greater will need to operate with high gain at frequencies between 3 GHz and 8 GHz. It would be desirable to design air cavity packages so that the length of the wires extending from the surface of the transistor to the leads of the package is as short as possible. The pedestal minimizes the wire bond distance between the surface of the semiconductor dice and the surface of the conductive leads, thereby reducing lead inductance and improving high frequency performance of the air cavity package. These devices can be used in applications requiring operation at frequencies from about 3 GHz to about 8 GHz, such as 5G wireless base-stations. In this regard, the pedestal fills the cavity of a dielectric frame, which is bonded to the flange with an adhesive and includes conductive leads attached to opposite sides of the dielectric frame. High frequency devices such as microwave power transistors and monolithic microwave integrated circuits (MMICs) are bonded to an upper surface of the pedestal.

Disclosed in various embodiments herein is an air cavity package adapted to contain a die which includes a flange having an upper surface, a pedestal having an upper surface and extending upward from the upper surface of the flange, and a dielectric frame having an upper surface and a lower surface. The lower surface of the dielectric frame attached to the upper surface of the flange, and the dielectric frame surrounds the pedestal. The pedestal can typically have a height from about 0.005 inches to about 0.020 inches.

The dielectric frame may be attached to the upper surface of the flange via a high temperature adhesive, such as a high temperature epoxy, a high temperature silicone, or a thermoplastic polyimide. High temperature adhesives are those with a decomposition temperature above 300° C.

The dielectric frame can be made of an alumina ceramic, a polyimide thermoplastic, or a semi-crystalline thermoplastic.

The air cavity package may further include a first conductive lead having an upper surface and a second conductive lead having an upper surface, attached to opposite sides of the dielectric frame. A die can be joined to the upper surface of the pedestal and approximately coplanar with the upper surface of the first and second conductive leads. The first conductive lead and the second conductive lead may be attached to the upper surface of the dielectric frame by a direct bond, a braze, a high temperature reactive solder, or a high temperature adhesive.

In some embodiments, the air cavity package can further include a lamination joined to the upper surface of the pedestal, wherein the die is joined to the lamination.

The pedestal can be monolithic with the flange and made from the same material, such as copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:CuMo:Cu (CPC), Mo, W, metallized BeO, metallized $Si_3N_4$, or metallized AlN.

In some embodiments, the pedestal can also be attached to the upper surface of the flange. The pedestal and the flange can be made from a different material. The pedestal can be made of CVD/diamond, Cu/diamond, CuAl, CuAg, CuW, CuMo, W, or Mo.

Also disclosed are methods for forming an air cavity package which include joining a first conductive lead and a second lead to an upper surface of a dielectric frame using a second attachment composition; forming a pedestal on an upper surface of a flange; placing the dielectric frame to surround the pedestal and joining a lower surface of the dielectric frame to the upper surface of the flange using a first attachment composition; and curing at least one of the first attachment composition and the second attachment composition.

The first attachment composition and the second attachment composition may independently be a high temperature adhesive such as a high temperature epoxy, a high temperature silicone, or a thermoplastic polyimide. High temperature adhesives are those with a decomposition temperature above 300° C.

In some embodiments, the pedestal may be formed by machining, stamping, coining, forging, direct casting, powder metallurgy, combinations thereof, or photoetching. In other embodiments, the pedestal may be joined to the upper surface of the flange using a low thermal resistance joint.

Sometimes, the methods can further comprise attaching a die to an upper surface of the pedestal, wherein an upper surface of the die is coplanar with an upper surface of the first conductive lead and the second conductive lead. In some embodiments, the die is first attached to a lamination, and the lamination is attached to the upper surface of the pedestal.

Sometimes, the methods can further comprise heating the dielectric frame to a temperature of about 200° C.-300° C., maintaining the flange and pedestal at room temperature, and pressing the dielectric frame around the pedestal.

In some embodiments, the methods further comprise plating the flange, the pedestal, and the first and second conductive lead with nickel (Ni), gold (Au), palladium (Pd), chromium (Cr), silver (Ag), or combinations thereof.

Also disclosed herein are air cavity packages adapted to contain a die, which include a flange having an upper surface; a pedestal having an upper surface, the die being attached to the upper surface of the pedestal, and the pedestal extending upward from the upper surface of the flange; and a dielectric frame surrounding the pedestal and having an upper surface and a lower surface, the lower surface being attached to the upper surface of the flange; wherein the pedestal is monolithically continuous with the flange and both are made of copper, the dielectric frame is made of a ceramic, and the lower surface is attached to the upper surface of the flange via a high temperature silicone adhesive.

Also disclosed in various embodiments are air cavity packages adapted to contain a die, which include a flange having an upper surface; a pedestal having an upper surface, the die being attached to the upper surface of the pedestal, and the pedestal extending upward from the upper surface of the flange; a dielectric frame surrounding the pedestal, the dielectric frame having an upper surface and a lower surface, the lower surface being attached to the upper surface of the flange; and a first conductive lead having an upper surface and a second conductive lead having an upper surface, attached to opposite sides of the upper surface of the dielectric frame; wherein the upper surface of the first and second conductive leads is coplanar with an upper surface of the die.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
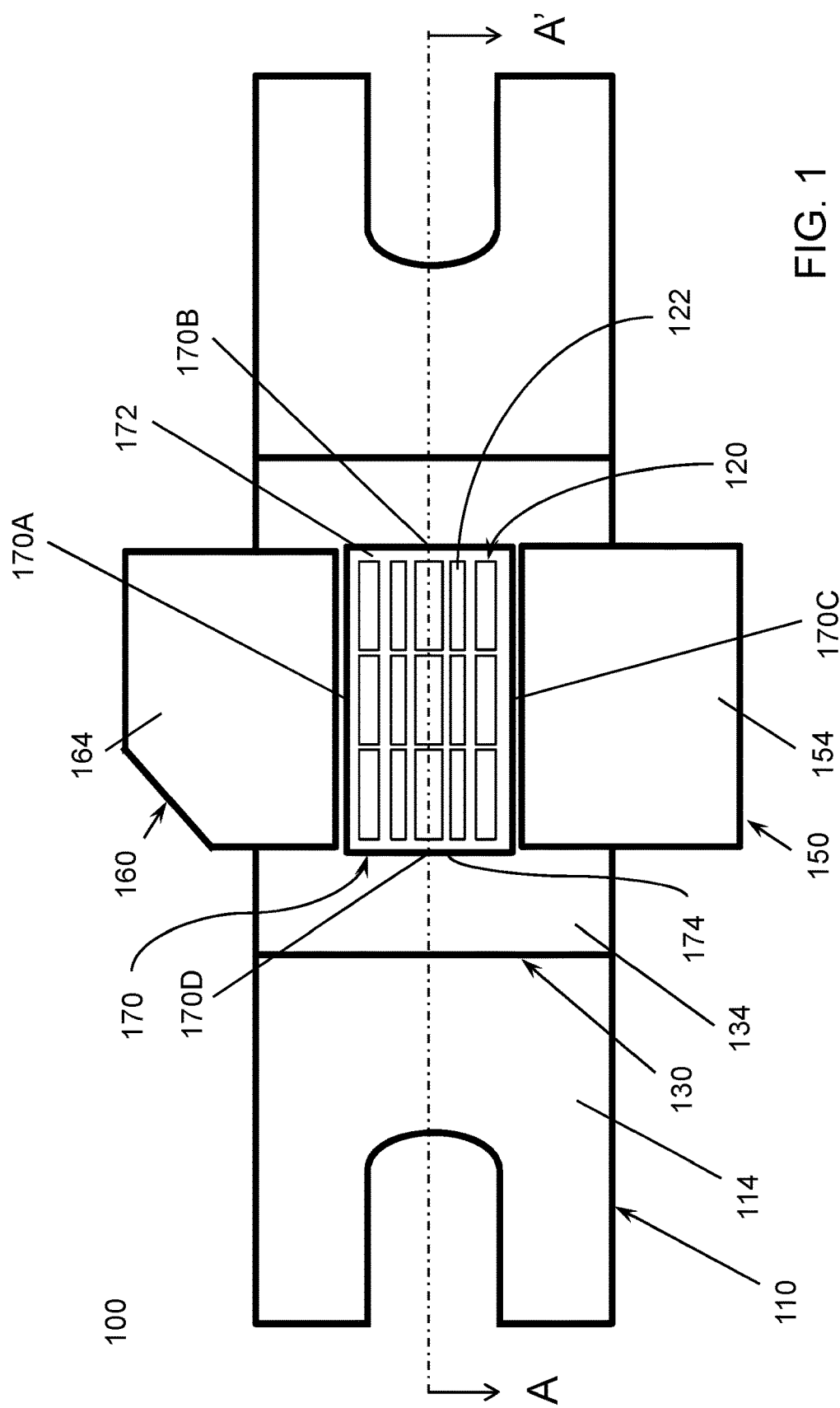
FIG. 1 is a top plan view of an exemplary air cavity package according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiment.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function. The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "substantially" and "about" can be used to include any numerical value that can vary without changing the basic function of that value. When used with a range, "substantially" and "about" also disclose the range defined by the absolute values of the two endpoints, e.g. "about 2 to about 4" also discloses the range "from 2 to 4." The terms "substantially" and "about" may refer to plus or minus 10% of the indicated number.

Some terms used herein are relative terms. In particular, the terms "upper" and "lower" are relative to each other in location, i.e. an upper component is located at a higher elevation than a lower component in a given orientation, but these terms can change if the component is flipped. When different components are compared to each other though, these terms refer to the components being in a fixed orientation relative to each other. For example, a lower surface of a first component will always rest upon an upper surface of a second component that is located below the first component; the first component cannot be flipped by itself so that its upper surface then rests upon the upper surface of the second component.

The terms "above" and "below" are relative to an absolute reference; a first component that is above a second component is always at a higher elevation.

As used herein, the term "coefficient of thermal expansion" or "CTE" refers to the linear coefficient of thermal expansion at or near 20° C.

The terms "plane" or "coplanar" are used herein in the lay sense to refer generally to two components being on a common level, and should not be construed in a strict mathematical sense.

The term "monolithic" as used herein refers to a relationship between components, wherein one component can be defined as "monolithic" or "monolithically continuous" with another component if the two components together are formed as one substantially solid or unbroken piece.

When an element is named alone, e.g. "aluminum", this usage refers to the element with only impurities present, e.g. pure aluminum. When used in conjunction with the term "alloy", this usage refers to an alloy containing a majority of the named element.

When two components are referred to as being "joined" together or "attached" to each other, this permits additional components to be between the two components, unless the phrase "directly joined" or "directly attached" is used, in which case the two components are attached to each other via some means such as adhesive.

Figure 2:
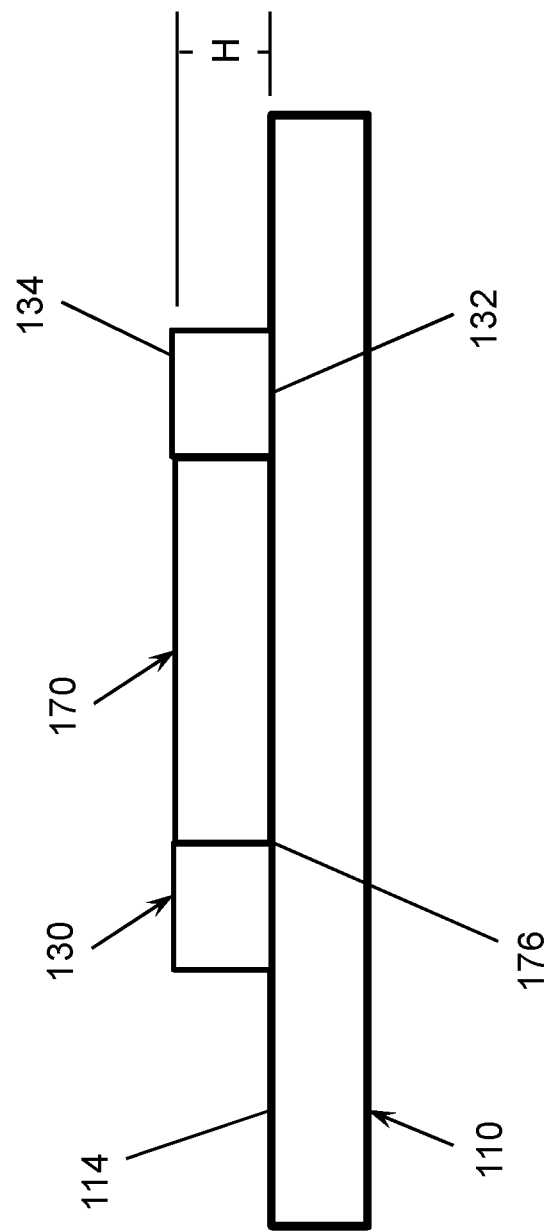
FIG. 2 is a cross-sectional side view taken along the line AA' of the air cavity package of FIG. 1.
Figure 3:
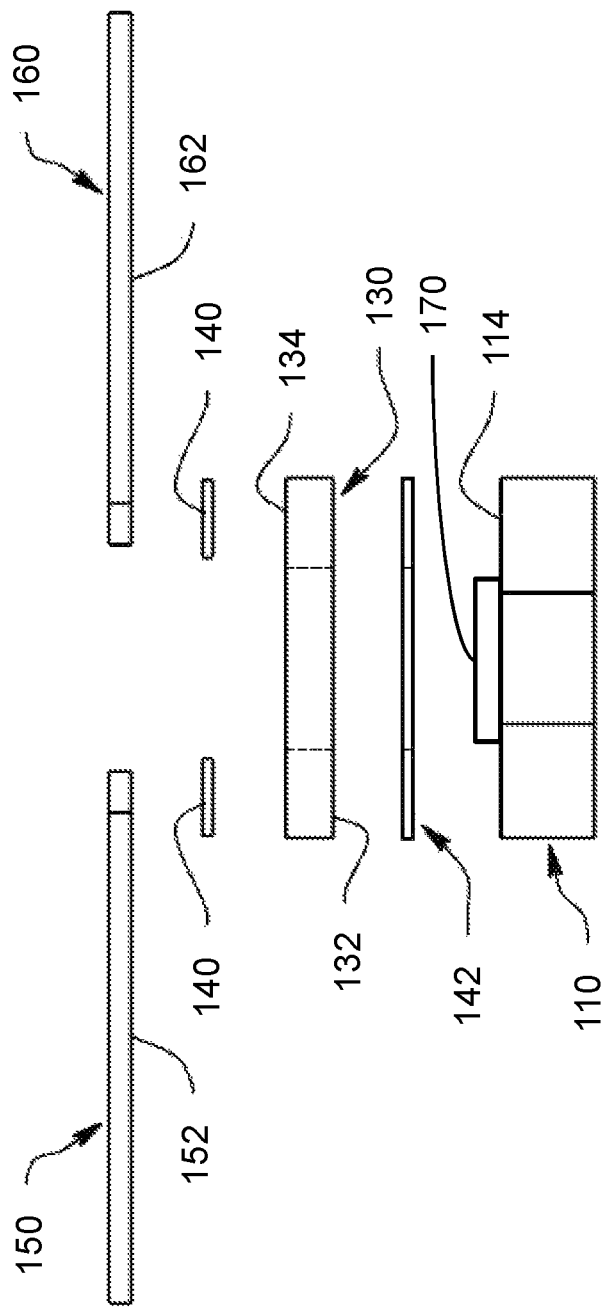
FIG. 3 is an exploded view of the air cavity package of FIG. 1.

FIG. 1 illustrates a top plan view of an air cavity package 100 according to the present disclosure. FIG. 2 is a cross-sectional side view of the air cavity package. FIG. 3 is an exploded side view of the air cavity package.

The air cavity package 100 includes a flange 110, a semiconductor die 120, a dielectric frame 130, a first conductive lead 150, a second conductive lead 160, and a pedestal 170. The flange is also referred to as the base of the air cavity package. An upper surface 134 of the dielectric frame 130 is attached to the lower surface 152, 162 of each conductive lead 150, 160 by a second attachment composition 140. The conductive leads 150, 160 are located on opposite sides of the package 100, or opposite sides of the dielectric frame 130 or the flange 110. A lower surface 132 of the dielectric frame 130 is attached to an upper surface 114 of the flange 110 by a first attachment composition 142. The first attachment composition 142 is generally applied around the base 176 of the pedestal 170 and optionally along the exterior sidewalls 170A, 170B, 170C, 170D of the pedestal. The dielectric frame 130 surrounds and encloses the pedestal 170, which extends upward from the upper surface 114 of the flange 110. The pedestal 170 and flange 110 can be formed together as a monolithic structure, or the pedestal can be separately formed and then joined to the flange. The die 120 is attached to an upper surface 172 of the pedestal 170. The dielectric frame has an annular shape, i.e. a shape defined by the area between two concentric shapes.

The flange 110 acts as a heat sink for the semiconductor die, and is made of a material with medium to high thermal conductivity. The flange can be made of copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:CuMo:Cu (CPC), Mo, W, metallized BeO, metalized $Si_3N_4$, or metallized AlN. It is noted that CPC refers to Cu:Cu30Mo70:Cu, which usually has thicknesses of 1:4:1 or 1:1:1 for the three sublayers. It is noted that the flange can be a metal matrix composite, such as graphite dispersed within an aluminum or copper metal matrix. In particular embodiments, the flange is in the form of a substrate that is plated with one or more metal sublayers on each major surface (e.g., a plating material compatible with AuSn or nanosilver die attachment). The one or more metal sublayers can be made of nickel (Ni), gold (Au), palladium (Pd), chromium (Cr), or silver (Ag).

The pedestal 170 is dimensioned so as to completely fill the interior region 174 defined by the annular shaped dielectric frame 130. The pedestal 170 acts as a lead inductance reducer and minimizes the wire bond distance between an upper surface 122 of the semiconductor die 120 and the upper surface 154, 164 of the leads 150, 160. Accordingly, the height H of the pedestal can be varied depending of the design of the circuit. The pedestal height H should be chosen such that the upper surface 122 of the die 120 is approximately coplanar with an upper surface 154, 164 of the leads. The height of the pedestal generally ranges from about 0.005 inches (0.13 mm) to a height approximately equal to the thickness of the dielectric frame, or about 0.020 inches (0.5 mm).

For optimal thermal performance, the pedestal and the flange can be monolithic, i.e. formed as one component. A monolithic pedestal can be formed into the flange by machining, stamping, coining, forging, direct casting or powder metallurgy, or combinations thereof. Alternatively, a pedestal can be photoetched into a copper (Cu) flanges. Photoetching of Cu flanges promotes good flange flatness and prevents burrs and edge roll. Photoetching of the flanges can produce discrete (singulated) flanges, or flanges connected by nibs into a panel. Flanges in panel format facilitate electroplating with Ni+Pd+Au without damaging the soft copper surfaces.

In some embodiments, optimal thermal performance can be achieved with a non-monolithic pedestal by bonding a separate pedestal to the flange with a low thermal resistance joint such as a high temperature solder, ultrasonic weld joint or braze. In these embodiments, the pedestal may be the same or different material as the flange. The different pedestal material can have a higher thermal conductivity than the flange, or a better CTE match to the die 120 compared with the flange. The pedestal may be made from CVD diamond, copper-diamond, copper-aluminum, copper-silver, copper-tungsten, copper-molybdenum, tungsten, and/or molybdenum.

The flange and pedestal can be plated with combinations of nickel (Ni), gold (Au), palladium (Pd), chromium (Cr), and silver (Ag), as desired. In particular combinations, the flange and pedestal are plated with Ni+Co, Ni:Co+Au, Ni+Au, Ni+Pd+Au, Ni+Cr, Pd+Au, or Ni+Ag, with the first listed element being plated first (i.e. closest to the substrate).

The die 120 can be bonded to the upper surface 172 of the pedestal 170 using AuSn solder, nanosilver, or silver-filled epoxy. In some embodiments, when it is not possible to directly bond the chip to the upper surface of the copper pedestal using AuSn solder, nanosilver, or silver-filled epoxy, the die can first be bonded to a chip carrier (not shown). The chip carrier can be a lamination of multiple layers made from various materials such as nickel (Ni) and/or molybdenum (Mo). In particular embodiments, the chip carrier is a lamination of three layers made from Ni/Mo/Ni. The lamination can be plated similar to the flange and pedestal with combinations of combinations of nickel (Ni), gold (Au), palladium (Pd), chromium (Cr), silver (Ag), as desired. In particular embodiments, the lamination is plated with Co:Ni and Au, with the first listed element being plated first (i.e. closest to the substrate).

The die 120 can be bonded to the chip carrier (not shown) with a high temperature reactive solder such as AuSi eutectic having a soldering temperature of about 420° C. Next, the die+chip carrier subassembly can be bonded onto the upper surface of the pedestal using an AuSn solder, SnAgCu solder, nanosilver, silver-filled epoxy, or silver filled polyimide adhesive, for example.

Next, the electrical leads 150, 160 may be made of copper, high purity aluminum, nickel, a copper alloy, a nickel-cobalt ferrous alloy (e.g., Kovar®), or an iron-nickel alloy (e.g., Alloy 42, i.e. Fe58Ni42). As with the flange and/or pedestal, the electrical leads can be plated with one or more metal sublayers, which are the same as described above.

In some embodiments, the leads 150, 160 can be attached to the dielectric frame 130, and the frame can be attached to the flange 110, by a high temperature adhesive. High temperature adhesives are those with a decomposition temperature above 300° C. Generally, the adhesive is then cured at a temperature of about 150° C. to about 260° C. and at a pressure of 1 psig to 10 psig.

In this regard, the attachment compositions 140, 142 both comprise an adhesive composition, which may be the same or different. In some particular embodiments, the attachment compositions 140, 142 generally include a strong, ductile high temperature adhesive (e.g., a high temperature epoxy, a high temperature silicone, or a thermoplastic polyimide). An optimal adhesive exhibits strong adhesive strength between the flange 110 and the dielectric frame 130 at elevated temperatures, e.g., 5 minutes at 320° C. The attachment compositions 140, 142 may consist of the main adhesive material or may include one or more other components. In some embodiments, the adhesive composition is filled with a dielectric material (e.g., glass and/or ceramic powder). Other adhesives may be applied in a layer above and/or below the main adhesive. In some embodiments, the main adhesive is a thermoplastic polyimide and the other adhesive is a high temperature epoxy or a high temperature polyimide-based adhesive. In some embodiments, the main adhesive is a high temperature silicone and the other adhesive is a different high temperature silicone.

Non-limiting examples of polyimide adhesives include adhesives sold by Polytec PT GmbH of Waldbronn, Germany and Fraivillig Technologies of Boston, Mass.

The use of a high temperature epoxy such as Materion's MEG-150 epoxy provides good adhesion to gold-plated copper flanges, and to polyimide frames. MEG-150 is applied as solid preform of B-staged material. It can be cured at a temperature of 160-180° C. and pressure of 10 psi (69 kPa).

High temperature silicones are commercially available in high purities, e.g., with low halogen and alkali content. The high temperature silicone can be in the form of a pure silicone. The high temperature silicone can also be described as a polydimethylsiloxane ("PDMS") lightly filled with silica particles. The term "lightly filled" refers to the amount of silica particles in the silicone as being about 20 volume percent or less of the silicone adhesive (but an amount greater than zero). Such silicones have been found to satisfy the requirements for this assembly. Silicones have the added advantage of being able to be dispensed as fluids. Silicones can typically be cured at a temperature of about 150° C. for about 30 minutes at a pressure in the range of about 5 psig to about 10 psig (34-69 kPa).

The use of a high temperature adhesive permits the use of a high purity aluminum alloy as the lead material. Aluminum (Al) leads would not require plating and facilitate Al wire bonding.

The leads 150, 160, dielectric frame 130, and flange 110 can be aligned in a fixture and bonded together by curing the adhesive composition. Once cured, a suitable high temperature epoxy, silicone or thermoplastic polyimide can withstand an excursion of 320° C. for 5 minutes (e.g., to enable AuSn die attachment) followed by thermal excursions necessary for wire bonding, lidding, and temperature cycle testing. Alternatively, the leads 150, 160 can be bonded to the dielectric frame 130 prior to bonding the dielectric frame to the flange 110.

In some embodiments, the dielectric frame 130 can be attached to the flange 110 by a high temperature adhesive as described above, and the leads 150, 160 can be attached to the dielectric frame 130 by a direct bond, a braze, or a solder. In this regard, the second attachment composition 140 and the first attachment composition 142 can be different materials. In these embodiments, the dielectric frame 130 is typically made of ceramic.

In particular embodiments, the frame 130 is made of a pre-metallized ceramic and the leads 150, 160 are joined to the frame with CuAg eutectic as the second attachment composition 140. CuAg eutectic is a conventional braze with a liquidus temperature of about 780° C.

In other particular embodiments, the frame 130 is a un-metallized ceramic and the leads 150, 160 are joined to the frame with a high temperature reactive solder as the second attachment composition 140.

In some particular embodiments, the frame 130 is a un-metallized alumina or zirconia toughened alumina (ZTA), the leads 150, 160 are made of copper, and the second attachment composition 140 represents a direct bond copper process. The direct bond copper process includes heating the copper leads and the dielectric frame to a temperature of approximately 1040° C. The lead+ceramic frame subassembly can then be bonded to the flange 110 using a high temperature epoxy, silicone or thermoplastic polyimide.

The dielectric frame 130 can be formed from a polyimide or other high temperature plastic. The dielectric frame may have a thickness (i.e. height) of from about 0.008 inches (0.2 mm) to about 0.03 inches (0.8 mm), including about 0.02 inches (0.5 mm).

The dielectric frame can be formed from a polyimide sheet, and such sheets are commercially available. The sheet can be machined in a variety of low cost methods such as stamping, laser cutting, water jet cutting, milling, and machining, to obtain the desired shape. A frame 130 made of polyimide may cost less than a conventional metallized and plated alumina frame. Additionally, the dielectric frame may be comprised of types of semi-crystalline thermoplastics having high temperature stability and high mechanical strength. An example of a semi-crystalline thermoplastic is a polyaryletherketone (PAEK).

The dielectric frame 130 may also be formed via injection molding or by direct forming. For example, polyimide resins can be injection molded or direct formed.

Optionally, the polyimide can be filled with an insulative, non-conducting filler to modify the properties of the dielectric frame. In some embodiments, the filler is a ceramic powder, glass powder or milled glass fibers. These fillers can reduce the CTE of the dielectric frame. The filler may be present in an amount of from greater than zero to about 50 volume percent of the dielectric frame.

The dielectric frame may have a dielectric constant in the range of from about 3.0 to about 10.0, including from about 3.0 to about 6.0, including from about 3.2 to about 3.8 and from about 3.4 to about 3.6. Alumina, polyimide, and certain semi-crystalline thermoplastics are suitable materials for the dielectric frame due to their dielectric properties.

Advantages of polyimide over LCP include a higher operating temperature, and compatibility with polyimide, epoxy and silicone adhesives (which are also suitable for high temperature operation).

Since LCP and polyimides exhibit similar dielectric constants, components matched to LCP dielectric frames also generally work well with polyimide frames. For example, a radio frequency power transistor designed to have RF impedance match with a LCP frame will also generally have RF impedance match with a polyimide frame.

A lid (not shown) may be added to seal the air in the air cavity of the package. In some embodiments, the lid comprises alumina ceramic or LCP. An epoxy may be used to bond the lid to the top surface of the frame, including the polyimide frame and the leads (e.g., gold-plated leads). The lid epoxy may be cured at a temperature of about 160-175° C. for 10-60 minutes.

A frame made of polyimide has a higher CTE than copper (CTE of Cu=17 ppm/° C.). Therefore, this property can be exploited to provide an interference fit for a frame 130 surrounding a pedestal 170. In some embodiments, the interference fit is provided for a polyimide frame 130 fitting about a pedestal 170 and flange 110 made from copper (Cu). Adhesive 142 can be applied around the base 176 and exterior sidewalls 170A, 170B, 170C, 170D of the copper pedestal 170. The adhesive 142 can be a high temperature adhesive such as silicone, epoxy, or thermoplastic polyimide. The polyimide frame 130 can be formed with the interior region 174 having smaller interior dimensions than the pedestal 170, such that the interior region of the frame would not fit around the pedestal at room temperature. However, if the polyimide frame is heated to a temperature from about 200° C. to about 300° C. and the copper flange is held at room temperature, the dielectric frame will expand so that the interior region 174 provides sufficient clearance to fit around the pedestal 170. The hot frame 130 is then placed atop the room temperature Cu flange 110 and pressed down and around the pedestal 170 to contact the adhesive 142. Leads 150, 160 are placed atop the frame with interposed adhesive, and the assembly is then placed in an oven to cure the adhesive. Interference fit assembly helps to minimize the gap (moat) between the top surface 172 of the pedestal and the inside walls of the polyimide frame (as seen in FIG. 1).

The air cavity packages of the present disclosure may be particularly suitable for commercial devices (e.g., cellular base station amplifiers). Such devices are not typically subjected to temperature cycling in the field. Therefore, moisture uptake is reduced.

Commercial laterally diffused metal oxide semiconductor (LDMOS) silicon transistors and GaN transistors used in base stations must be in air cavity packages compatible with Moisture Sensitivity Level 3 (MSL 3). Essentially, MSL 3 exposes the lidded assembly to 30° C.+60% relative humidity for 192 hours, followed by a specific solder reflow thermal profile that peaks at 200° C. The lidded package must then pass gross leak testing in Fluoroinert®, and pass other testing requirements. Current manufacturers extensively use epoxy overmolded packages. Such packages are low cost and pass MSL 3.

The air cavity packages of the present disclosure may generally be able to withstand the sequential steps of AuSn die attachment (320° C.), lid sealing with epoxy (160° C.), and temperature cycling (e.g., −65° C. to +150° C. for 1000 cycles).

EXAMPLES

Example 1: Ear'd CuPacks

Copper (Cu) leads having a thickness of about 0.008 inches (0.2 mm) were bonded to the upper surface only of an alumina frame having a thickness of about 0.02 inches (0.5 mm) using the direct bond copper process. Direct bonding was performed in a controlled oxygen content belt furnace at approximately 1040° C. After bonding, the leads were plated with nickel (Ni) at a thickness of about 100 micro-inches or more, followed by gold (Au) at a thickness of at least 30 micro-inches. The copper leads and the ceramic frames were then singulated resulting in discrete lead+frame subassemblies. A pedestal having a height of about 0.02 inches (0.5 mm) was created by photoetching an ear'd copper (Cu) flange having a thickness of about 0.04 inches (1 mm). The area of the pedestal was slightly smaller than the interior area of the alumina frame. The Cu flange was plated with nickel (Ni) at a thickness of about 100 micro-inches or more, followed by gold (Au) at a thickness of at least 60 micro-inches. In order to reduce cost, it may be desirable to plate with Au at a thickness of at least 30 micro-inches. A syringe was used to dispense silicone adhesive at the corner between the pedestal and the flange. The ceramic frame+Cu leads subassembly was positioned about the pedestal and pressed onto the silicone adhesive. The assembly was then placed in a curing oven at about 160° C. for 30-40 minutes to fully cure the silicone adhesive. The assembled header was compatible with semiconductor chips bonded to the pedestal with AuSn solder, nanosilver or silver-filled epoxy.

Example 2: Active Soldered Leads on a Ceramic Frame

Example 2 is applicable to air cavity packages having an air cavity area ranging in size from about 0.080 inches× 0.120 inches (2 mm×3 mm) up to about 1.10 inches×0.270 inches (28 mm×6.8 mm). Example 2 is applicable to flanges with or without bolt-down ears.

Leads made from Alloy 42 and having a thickness of about 0.004 inches (0.1 mm) were plated with nickel (Ni) at a thickness of about 100 micro-inches or more, followed by gold (Au) at a thickness of at least 60 micro-inches. The leads were soldered onto a 0.02 inches (0.5 mm) thick, un-metallized alumina frame using a high temperature active metal solder. A pedestal having a height of about 0.02 inches (0.5 mm) was created by photoetching an ear'd Cu flange having a thickness of about 0.04 inches (1 mm). The area of the pedestal was slightly smaller than the interior area of the alumina frame in order to account for the tolerances in forming the pedestal and the frame. The flange was plated with nickel (Ni) at a thickness of about 100 micro-inches or more, followed by gold (Au) at a thickness of at least 60 micro-inches. A syringe was used to dispense silicone adhesive at the corner between the pedestal and the flange. Optionally, a jet printer could be used to dispense the silicone adhesive. The ceramic frame+Alloy 42 leads subassembly was positioned about the pedestal and pressed onto the silicone adhesive. The assembly was then placed in a curing oven at about 160° C. for 30-40 minutes to fully cure the silicone adhesive. The assembled header was compatible with semiconductor chips bonded to the pedestal with AuSn solder, nanosilver or silver-filled epoxy.

Example 3: Glued Leads on a Ceramic Frame

Example 3 is applicable to air cavity packages having an air cavity area ranging in size from about 0.080 inches× 0.120 inches (2 mm×3 mm) up to about 1.10 inches×0.270 inches (28 mm×6.8 mm). Example 3 is applicable to flanges with or without bolt-down ears.

Leads made from Alloy 42 and having a thickness of about 0.004 inches (0.1 mm) were plated with nickel (Ni) at a thickness of about 100 micro-inches or more, followed by gold (Au) at a thickness of at least 60 micro-inches. Silicone adhesive was dispensed onto each lead near the edge corresponding to each lead's overlap with the frame. A pedestal having a height of about 0.02 inches (0.5 mm) was created by photoetching an ear'd Cu flange having a thickness of about 0.04 inches (1 mm). The area of the pedestal was slightly smaller than the interior area of the alumina frame in order to account for the tolerances in forming the pedestal and the frame. The flange was plated with nickel (Ni) at a thickness of about 100 micro-inches or more, followed by gold (Au) at a thickness of at least 60 micro-inches. A syringe was used to dispense silicone adhesive at the corner between the pedestal and the flange. The alumina frame had a thickness of about 0.02 inches (0.5 mm) and was unmetallized. The Alloy 42 leads+ceramic frame were positioned about the pedestal and pressed onto the silicone adhesive on the flange using an alignment fixture or jig. The assembly was then placed in a curing oven at about 160° C. for 30-40 minutes to fully cure the silicone adhesive joints on both faces of the alumina frame. The assembled header was compatible with semiconductor chips bonded to the pedestal with AuSn solder, nanosilver or silver-filled epoxy.

Example 4: Glued Leads on a Polyimide Frame

Example 4 is applicable to air cavity packages having an air cavity area ranging in size from about 0.080 inches× 0.120 inches (2 mm×3 mm) up to about 1.10 inches×0.270 inches (28 mm×6.8 mm). Example 4 is applicable to flanges with or without bolt-down ears.

Copper (Cu) leads having a thickness of about 0.004 inches (0.1 mm) were plated with nickel (Ni) at a thickness of about 100 micro-inches or more, followed by gold (Au) at a thickness of at least 60 micro-inches. Silicone adhesive was dispensed onto each lead near the edge corresponding to each lead's overlap with the frame. Polyimide frames having a thickness of about 0.02 inches (0.5 mm) were created by machining, though they could also be created by direct forming. A pedestal having a height of about 0.02 inches (0.5 mm) was created by photoetching an ear'd Cu flange having a thickness of about 0.04 inches (1 mm). The area of the pedestal was slightly smaller than the interior area of the alumina frame in order to account for the tolerances in forming the pedestal and the frame. The flange was plated with nickel (Ni) at a thickness of about 100 micro-inches or more, followed by gold (Au) at a thickness of at least 60 micro-inches. A syringe was used to dispense silicone adhesive at the corner between the pedestal and the flange. The polyimide frame was heated to 250° C. and then pressed about the pedestal of the flange, which was held at room temperature. After the polyimide cooled down to room temperature, the gap between the pedestal and the frame was minimal or filled with silicone as seen in plan view. The copper leads were pressed onto the polyimide frame using an alignment fixture or jig. The assembly was then placed in a curing oven at about 160° C. for 30-40 minutes to fully cure the silicone adhesive joints on both faces of the polyimide frame. The assembled header was compatible with semiconductor chips bonded to the pedestal with AuSn solder, nanosilver or silver-filled epoxy.

Example 5: Semiconductor Die Soldered to a Chip Carrier

For a variety of reasons, it may not be possible to directly bond the chip to the upper surface of the copper pedestal using AuSn solder or nanosilver. Instead, the chip can be bonded to a chip carrier first, followed by bonding of the chip+chip carrier subassembly onto the surface of the pedestal of the air cavity packages described in Examples 1-4 above.

A lamination of 19 µm Ni/343 µm Mo/19 µm Ni was used for the chip carrier. This lamination was plated with Co:Ni at a thickness of about 100 micro-inches or more, followed by gold (Au) at a thickness of at least 100 micro-inches. The lamination was then stamped into rectangles having an area slightly smaller than that of the pedestal. An RF power semiconductor chip made of Si or GaN/Si was soldered onto the chip carrier using AuSi eutectic at 420° C. This subassembly was then bonded to the top surface of the pedestal of the package (described in Examples 1-4) with AuSn solder, SnAgCu solder, nanosilver, silver-filled epoxy, or silver-filled polyimide adhesive.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. An air cavity package adapted to contain a die, comprising:
   a flange having an upper surface;
   a pedestal extending upward from the upper surface of the flange; and
   a dielectric frame surrounding the pedestal and having an upper surface and a lower surface, the lower surface being attached to the upper surface of the flange with a high temperature epoxy adhesive, a high temperature silicone adhesive, or a thermoplastic polyimide adhesive; and
   at least one conductive lead attached to the upper surface of the dielectric frame.

2. The air cavity package of claim 1, wherein the pedestal and the flange are formed as a monolith.

3. The air cavity package of claim 1, wherein the pedestal is attached to the upper surface of the flange, and the pedestal and the flange are made from a different material.

4. The air cavity package of claim 3, wherein the pedestal is made of CVD/diamond, Cu/diamond, CuAl, CuAg, CuW, CuMo, W, Mo, copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:CuMo:Cu (CPC), Mo, W, metallized BeO, metallized $Si_3N_4$, or metallized AlN.

5. The air cavity package of claim 1, wherein the flange is made of copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:CuMo:Cu (CPC), Mo, W, metallized BeO, metallized $Si_3N_4$, or metallized AlN.

6. The air cavity package of claim 1, further comprising a first conductive lead having an upper surface and a second conductive lead having an upper surface, attached to opposite sides of the upper surface of the dielectric frame.

7. The air cavity package of claim 6, wherein the first conductive lead and the second conductive lead are attached to the upper surface of the dielectric frame by a direct bond, a braze, a high temperature reactive solder, or a high temperature adhesive.

8. The air cavity package of claim 6, further comprising the die, which is attached to an upper surface of the pedestal, wherein the die is approximately coplanar with the upper surface of the first and second conductive leads.

9. The air cavity package of claim 6, wherein the die is joined to a chip carrier which is attached to the upper surface of the pedestal.

10. The air cavity package of claim 1, wherein the pedestal has a height from about 0.005 inches to about 0.020 inches.

11. The air cavity package of claim 1, wherein the dielectric frame is made of an alumina ceramic, a polyimide thermoplastic, or a semi-crystalline thermoplastic.

12. A method for forming an air cavity package, comprising:
receiving a flange with a pedestal extending upwards from an upper surface of a flange;
surrounding the pedestal with a dielectric frame, the dielectric frame having an upper surface and a lower surface;
attaching the lower surface of the dielectric frame to the upper surface of the flange using a first attachment composition; and
joining a first conductive lead and a second conductive lead to the upper surface of the dielectric frame using a second attachment composition;
wherein the first attachment composition and the second attachment composition are independently a high temperature epoxy adhesive, a high temperature silicone adhesive, or a thermoplastic polyimide adhesive.

13. The method of claim 12, further comprising attaching a die to an upper surface of the pedestal, wherein an upper surface of the die is coplanar with an upper surface of the first conductive lead and the second conductive lead.

14. The method of claim 12, wherein the pedestal is formed by machining, stamping, coining, forging, direct casting, powder metallurgy, combinations thereof, or photoetching.

15. The method of claim 12, wherein the pedestal is surrounded by the dielectric frame by heating the dielectric frame to a temperature of about 200° C. to about 300° C., maintaining the flange and pedestal at room temperature, and pressing the dielectric frame around the pedestal.

16. An air cavity package, comprising:
a flange having an upper surface;
a pedestal that extends upward from the upper surface of the flange, the pedestal having an upper surface;
a semiconductor die attached to the upper surface of the pedestal; and
a dielectric frame surrounding the pedestal and having an upper surface and a lower surface, the lower surface being attached to the upper surface of the flange;
wherein the pedestal and the flange are made of copper, the dielectric frame is made of a ceramic, and the lower surface of the dielectric frame is attached to the upper surface of the flange by a high temperature silicone adhesive.

17. An air cavity package adapted to contain a die, comprising:
a flange having an upper surface;
a pedestal that extends upward from the upper surface of the flange, the pedestal having an upper surface;
a semiconductor die attached to the upper surface of the pedestal;
a dielectric frame surrounding the pedestal and having an upper surface and a lower surface, the lower surface being attached to the upper surface of the flange with a high temperature epoxy adhesive, a high temperature silicone adhesive, or a thermoplastic polyimide adhesive; and
a first conductive lead having an upper surface and a second conductive lead having an upper surface, attached to opposite sides of the upper surface of the dielectric frame;
wherein the upper surfaces of the first and second conductive leads are coplanar with an upper surface of the die.

* * * * *